US006801884B2

(12) United States Patent
Ferreri et al.

(10) Patent No.: US 6,801,884 B2
(45) Date of Patent: Oct. 5, 2004

(54) METHOD AND APPARATUS FOR TRAVERSING NET CONNECTIVITY THROUGH DESIGN HIERARCHY

(75) Inventors: Richard Anthony Ferreri, Ft. Collins, CO (US); Lanzhong Wang, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 645 days.

(21) Appl. No.: 09/779,965

(22) Filed: Feb. 9, 2001

(65) Prior Publication Data

US 2002/0112221 A1 Aug. 15, 2002

(51) Int. Cl.[7] ............................................. G06F 17/50
(52) U.S. Cl. .......................................... 703/13; 703/17
(58) Field of Search ............................. 703/13, 14, 17; 716/12, 18, 8

(56) References Cited

U.S. PATENT DOCUMENTS 5,838,583 A * 11/1998 Varadarajan et al. ........... 716/9
6,044,211 A * 3/2000 Jain ............................. 716/18
6,505,328 B1 * 1/2003 Van Ginneken et al. ........ 716/7
6,519,755 B1 * 2/2003 Anderson ..................... 716/18
6,529,913 B1 * 3/2003 Doig et al. .................. 707/101
6,574,787 B1 * 6/2003 Anderson ..................... 716/18

* cited by examiner

Primary Examiner—Thai Phan

(57) ABSTRACT

The present invention allows traversal of net occurrences of a light weight occurrence model. In traversing down, a port iterator is preferably used, while in traversing up a port instance iterator is preferably used. The selected iterator is initialized with information about the current occurrence net from the inventive occurrence node that describes the occurrence net's owner and folded model describer. In traversing up, the iterator finds the next port that connects to the folded model net indicated by the describer used during initialization. Then, using information stored in the model, the iterator finds the occurrence net object that is one level higher in hierarchy than the original occurrence net object. In traversing down, the iterator finds the next port instance that connects to the folded model net indicated by the describer used during initialization. Then, using information stored in the model, the iterator finds the occurrence net object that is one level lower in hierarchy than the original occurrence net object.

20 Claims, 6 Drawing Sheets

METHOD AND APPARATUS FOR TRAVERSING NET CONNECTIVITY THROUGH DESIGN HIERARCHY

RELATED APPLICATIONS

The present application is related to co-pending and commonly assigned U.S. patent application Ser. No. 09/709,695, entitled "MEMORY EFFICIENT OCCURRENCE MODEL DESIGN FOR VLSI CAD," filed Nov. 10, 2000, the disclosure of which is hereby incorporated herein by reference.

TECHNICAL FIELD

This application is related in general to VLSI CAD design, and in specific to an apparatus and method for traversing a design that uses a lightweight occurrence model.

BACKGROUND

Prior computer aided design (CAD) systems represent designs in a hierarchical connectivity form that provides design information to system designers with different levels of abstraction. An example of such a schematic configuration 100 is shown in FIG. 1, which depicts the relationships between a cell 101, a port 102, a net 103, an instance 104, and a port instance 105. Such a configuration is known as a folded connectivity model. The cell block 101 describes a device or structure of the system, e.g., a full adder. A cell contains collections of instances of other cells, nets (which are wires) and the external interfaces to the cell (ports). The net block 103 describes the wires that make up the internal connections within the cell block. The port block 102 describes the interface to the cell and provides the connection points for the nets (wires) to carry ("Co") signals into and out of the cell block's logic.

As stated above, a cell block provides the definition of a device or structure. Once a cell has been defined, it can then be instantiated (wherein an instance block 104 is created of that cell), so that it may be used in other cell definitions. In this way, a design hierarchy can be created. The instance block describes the devices or structures used to form the functionality of a cell, e.g., for a two bit adder: two full adder cell instances are created. Just as an instance records the instantiation (or use of) a cell block, the port instance block 105 records the instantiation of the ports on the cell. The port instances allow us to record the specific nets that are connected to a given instance.

The hierarchical nature of the information stored in the folded connectivity model is shown by way of example only in FIGS. 2A–2C. FIG. 2A depicts the highest level of hierarchy, that is cell block 200, which is a two bit adder. The two bit adder block has 8 ports (the inputs A1, B1, A0, B0, Cin; and the outputs Cout, S1, and S0). It contains the nets that are connected to these ports (A1, B1, A0, B0, Cin, Cout, S1, and S0), in addition to one internal net (Co) which is not connected to a port on the cell boundary, but is none-the-less a net contained within the two bit adder cell definition. Finally, the two bit adder contains two instances, FA0 block 202 and FA1 block 203, each of which are instances of a full adder (or a one-bit adder).

FIG. 2B depicts the next lower level of the hierarchy of the system, showing the cell definition for the full adder. Note that the instances FA0 (block 202) and FA1 (block 203) in the top level are described by a cell at the next lower level of hierarchy. The full adder block 201 has 5 ports (input ports A, B, and Cin; the output ports S and Co). It also contains 11 nets (ported nets A, B, Cin, Co, and S; internal nets Co sig_1, sig_2, sig_3, sig_4, and sig_5), and 8 instances (2 instances of an inverter, I1, and I2; 2 instances of a 2-input NOR gate, NO1, NO2; 2 instances of a 2-input XOR gate, XO1 and XO2; and 2 instances of a 2-input NAND gate, NA1 and NA2). Finally, FIG. 2C depicts one of the cells at the lowest level of hierarchy, the 2-input NAND gate. Note that there are 3 other cells at this same level of hierarchy that are not depicted (namely the inverter, the 2-input NOR gate, and the 2-input XOR gate). Additional levels of hierarchy may exist, e.g., one or more levels higher than FIG. 2A.

A folded connectivity model provides a memory efficient representation of source VLSI design data as seen by the VLSI designer. A fundamental limitation of the folded connectivity model, however, is its ability to represent a truly unique addressable object for each object created across the many levels of design hierarchy. Although this is not an issue for many existing CAD tools, it is becoming more of an issue for the next generation analysis and design tools which need to analyze design entities that span the hierarchy. The design of FIGS. 2A–2C can be walked through to illustrate the fundamental limitation of a folded connectivity model. In these FIGURES, the top level cell FIG. 2A contains two instances of the cell "full_adder", FA0 and FA1. The cell "full_adder" contains two instances of the block "nand_2", NA1 and NA2. This information is recorded in the folded connectivity model as shown in FIG. 4. Notice that, in this diagram, there is only one cell 406 for the NA1 and NA2 instances (blocks 415 and 405 respectively). But, when the same design in the form shown in FIG. 3 is viewed, there are in reality, two different occurrences of the instance NA1 (FA0/NA1 and FA1/NA1). The same is true for the instance NA2 (and, as a result, the nets contained within the describing cells for each of these instances). The folded connectivity model only records that a single instance of cell "nand_2" named NA1 is an element of the cell "full_adder".

A common technique used to avoid this problem is to perform a 'flattening' process. The process of flattening a hierarchical design removes all intermediate levels of hierarchy, so only primitive elements exist. There are two primary problems with flattening. First, flattening uses a great deal of computer memory. With today's microprocessor designs, it is often impossible to flatten the entire hierarchy. The second problem is that flattening is a one-way process. Once flattened, it is impractical to relate flattened circuit elements back to a hierarchical view.

For these reasons, the occurrence (or unfolded) model representation is becoming a more important representation for many of today's CAD tools. In a typical occurrence model, each and every cell is stored, including those cells that are duplicated, while retaining the notion of the original design hierarchy. The primary advantage of an occurrence model is that it allows tools to obtain the benefits of flattening (being able to see a flattened view of the design and the interconnecting nets that span hierarchy) without losing hierarchical information. In addition, using an occurrence model gives some flexibility to the tool developer, so that they do not have to build a model to represent the entire design, only for those pieces currently being evaluated. As an example, each adder 202 and 203 is stored separately in the model, as well as each second NAND (N2) circuit 205, 208 or each adder, and each N2 transistor 207, 209 of N2 circuit, as shown in FIG. 3. FIG. 3 depicts the multi-level view of the cell of FIG. 1 with the different levels of the example of FIGS. 2A–2C. (Note that for simplicity, the other elements of the circuit, as well as the sub-elements, e.g., I1, I2, XO1, XO2, NO1, and NO2 are not shown.) However, modern IC circuits, e.g., processors, comprise millions of instances. Thus, the size of the model quickly becomes large as the lower levels are added to the model. Current computer systems do not have adequate memory to store the complete occurrence model. However, the lower levels are becoming more important to designers. The presence of the lower levels in the model allows for more detailed analysis of the system, e.g., for parasitic losses from the net connections, which thereby improves the speed and efficiency of the system.

FIG. 4 depicts a partial example of the in-memory representation of the folded connectivity model for the schematic design described in FIG. 2. In this model, only one copy of lower level instances are maintained. Pointers 409–414 are used to associate an upper level cell with lower level instances of that cell. FIG. 4 models the same example as shown in FIGS. 2A–2C and 3. This model does not store specific instance and net occurrence information. Instead, each instance of a cell points to a generic higher level cell known as the describer cell). For example, the 2 bit adder cell 400 includes two instances of full adders 402, 403. Each of these instances 402, 403 point, via pointers 410, 409 to the same full adder describer cell 404. Full adders other than instances 402, 403 will also point to full adder cell 404. Thus, less information is stored for the model. This describer relationship between instances and cells using a describing cell pointer is carried down through the different levels of the design hierarchy, e.g. NAND circuits 405, 415 both point to NAND cell 406, and transistors 407, 416 both point to P cell 408. Thus the folded model will only have one cell for each instance type, whereas the occurrence model will have a different cell for each occurrence of each instance. For example, the folded model has only one cell for the P transistor, namely cell 408, while the occurrence model, as shown in FIG. 3 has four cells (or unique occurrences of the cell), one for each of P1 and P2 of FA0, and P1 and P2 of FA1 (note that additional P cells are likely to be present in the occurrence model, since XO1, XO2, NO1, NO2, I1, and I2 are also likely to use P transistor as sub-elements, but are not shown in FIG. 3). Thus, the folded model is significantly smaller than the occurrence model. Note that the folded model would include port information, which has not been shown in FIG. 4 for simplicity. Also FIG. 4 does not depict all of the cells, e.g., NO1 or NO2, for simplicity.

However, the folded model does not store any occurrence specific information. This means that analysis performed on the model will not accurately reflect some of the phyisical aspects of the actual design. For example, the analysis for delay or parasitic effects will not be accurate, since the context of each instance is not stored in the design. As only a generic cell is stored for each instance type, then the same information will be used in the analysis of each instance in design. In actuality, each instance is different. For example, only one set of information for the Y net will be stored in the folded model, however, each occurrence of the Y net is different, e.g., each occurrence has different delays and/or parasitic effects because, for example, of the different placement for each Y net. However, the folded model does not store these differences, and thus will not provide accurate analysis of the design.

Furthermore, analysis of the folded model is difficult because traversing the net signals up and down through the hierarchy is hindered because of the lack of information. Using the 2_BIT_ADD as an example: there is a net b in the middle level of the hierarchy of the system (full adder FIG. 2B). Net B connects to three instance NO1, XO1, and NA1. Suppose a designer wants to trace down timing delay information and therefore needs to go down to the next lower level, for example, to the net Y in NA1 that connects to net B. However, in the folded model, it is very difficult to find which nets on the lower (or higher levels) connect to the current net, since different nets belong to different cells and there is no information in the folded model that describes the lower level connections of the current net B at the lower level cell instance NO1, XO1, and NA1. (The higher level net connections at higher level 2_BIT_ADD) Using port and port instance, the corresponding net can be found at the next level, such as Y in NA. However, designers still cannot tell the differences between net Y 211 and net Y 212, since there is only one Y 420 under Cell Block NA 406, and both net Y 211 and net Y 212 belong to instance NA1 415. This difficulty will also apply to net traverse to the upper level in the hierarchy as well. Therefore, efficiently tracing net signals up and down in the hierarchy is a big challenge for the prior art design tools.

Designers may use hash tables to store the some unique instance information that is not stored in the folded model, such as the timing delay data for net Y 211 and net Y 212. Note that such tables are not part of the folded model and are stored separately from the model. Tables are created by the designers and include information that designer is interested in using in the analysis of the design. However, models that use these tables are not memory efficient and tend to run slow because poor homemade designs. Also the tables are transient, they are maintained only for the analysis of interest and then discarded. This is because each device needs its own hash table. Thus, the homemade hash tables are not portable, i.e., the hash tables cannot be reused by the different designers working on the larger system. Each designer creates their own tables. Hash tables allow designers to write certain net information into files. When following port and port instances to get to the desired level instance, the corresponding file is opened to retrieve the necessary information. However, this is not memory efficient and is slow and not reusable by different applications.

The prior art fails to provide designers with a mechanism to traverse nets up and down in the hierarchy, which is critical for any global net based analysis application such as timing analysis.

SUMMARY OF THE INVENTION

The present invention is directed to a system and method that traverses net occurrences of a light weight occurrence model.

The lightweight occurrence model preferably uses the arrangement of the folded model, but includes occurrence nodes that are associated with the folded model. As a result, the lightweight occurrence model augments the arrangement of the folded model in order to include the occurrence nodes (the missing context) and then provides a rich API to allow programmers to traverse through the occurrence nodes. There is preferably at least one occurrence node for each cell instance or net in the folded model. Each occurrence node includes occurrence specific data or a pointer to such data, a pointer to an owner occurrence node, and a pointer to a folded model instance. Thus, most of the information that is present in a full occurrence model can be included in the inventive lightweight occurrence model.

In order to keep the occurrence model lightweight, information that can be obtained from the folded model (such as the relationships between ports, port instances, and nets) are preferably not duplicated in the in-memory representation. This invention allows a user to move up or down the net hierarchy (one level at a time) without needing to know the details of the implementation or the details of the relationships to the folded connectivity model. Occurrences of ports are not maintained because this information can be obtained from the folded model and the inclusion of them in the occurrence model would increase the memory use by approximately two orders of magnitude. Therefore, the ability to easily move up and down the net hierarchy without having to know the implementation details is essential in making a usable occurrence model. This is accomplished by providing two iterators for occurrence nets that provide the illusion that the model stores all of the occurrence nets connected to any given occurrence net one level above or below in hierarchy, yielding a very simple and abstract interface for the user despite the fact that very complex computation is occurring within the iterators.

The invention begins the traversal by initializing the inventive iterator with information about the current occurrence net from the inventive occurrence node that describes the occurrence net's owner and folded model describer. In traversing down, a port iterator is preferably used, while in traversing up a port instance iterator is preferably used. This is because of the design convention that from the outside of an object a connection is a port instance, while from the inside, the connection is a port.

In traversing up, the iterator finds the next port that connects to the folded model net indicated by the describer used during initialization. The iterator then locates the instance in the folded model pointed to by the describer of the owner of the net object. Next, using the instance and the next port, the iterator locates the corresponding port instance. Since each port instance can only connect to one net, then the iterator can retrieve the net that connects to the port instance, which is the folded model net that is one level higher in hierarchy then the original occurrence net object. The iterator then uses the net object owner's owner pointer as a search key in searching a map container of the retrieved folded model net. This search should find the occurrence net object that is associated with the folded model net, and is one level higher in hierarchy than the original occurrence net object. If there is no match in the search, the iterator repeats the operation for the next port that is connected to the folded model. If during operation, the iterator encounters nulls, then the iterator ends the operation.

In traversing down, the iterator finds the next port instance that connects to the folded model net indicated by the describer used during initialization. The iterator then retrieves the port that describes the port instance. Since each port can connect to only one net, the iterator then retrieves the net that is connected to the port in the folded model. The iterator uses the owner of the net object as a search key to search a map container of the port instance's owner, which is an instance. This search yields the occurrence cell that owns the net object that is one level lower in hierarchy than that of the original net object. This occurrence cell is used as a search key to search a container of the retrieved net. This search should find the occurrence net object that is associated with the folded model net, and is one level lower in hierarchy than the original occurrence net object. If there is no match in this search, the iterator repeats the operation for the next port instance that is connected to the folded model. This search may be repeated to find additional occurrence net objects that are one level lower than the original net object. If during operation, the iterator encounters nulls, then the iterator ends the operation.

The present invention is directed to a system and method which facilitates traversal of a lightweight folded occurrence model which includes aspects of both the folded model and the occurrence model.

The inventive lightweight occurrence model uses the arrangement of the folded model but includes occurrence nodes that are associated with the folded model. There is at least one occurrence node for each instance of an object type in the model. Each occurrence node includes occurrence specific data or a pointer to such data, a pointer to a parent occurrence node, and a pointer to a folded model instance. Thus, most of the information that is present in a full occurrence model can be included in the inventive lightweight occurrence model. Since the inventive occurrence model is smaller than the full occurrence model, the entirety of complex circuit designs, e.g., microprocessors, can be represented by the inventive lightweight occurrence model. Thus, low level characteristics of the design, e.g., parasitics, can be examined.

The pointers, or other abstract interfaces, allows the information of the nodes of the folded model to be altered to include the unique data of the instances of the occurrence model, including its hierarchical location in the model. Thus, the entirety of the full occurrence model can be represented by the inventive lightweight occurrence model, depending upon the amount of specific data associated with the node (either stored in the node or pointed to by the node). Note that the occurrence node names do not have to be stored in the nodes. The name of the node, if needed for analysis and not stored, can be constructed from information in the inventive light weight occurrence model. Note that the occurrence nodes do not store information that is already present in the folded model, e.g., information on child nodes and/or information about the relationships of ports, cells, and nets. Consequently, the memory required for the inventive lightweight occurrence model is significantly less than that required for the full occurrence model. For example, an inventive node storing only three pointer may require 12 bytes, while a full occurrence node may require 40 or more bytes, meaning that the inventive lightweight occurrence model would only require about 30% of the memory required for the full occurrence model.

Another aspect of the present invention is that the lightweight occurrence model may be displayed to a user, such that only a desired level of hierarchy for a desired portion of the model is shown to the user. In the prior art, the full occurrence model forces the folded model to be unfolded to the lowest level of the model. Note that this allows the model to have more detailed (lower level) information to be stored for a particular portion, while having only less detailed (higher level) information stored for the remainder of the model. This allows a partial tree to be used, with some branches having more detailed information than other branches.

As stated above, the occurrence node names do not have to be stored in the nodes. However, the model needs to work with tools that require node names for performing analysis on the designs that use the model. Typically, the analysis is hierarchical based analysis, and thus hierarchical names are required. However, in the invention, the names of the nodes can be constructed from information in the inventive light weight occurrence model, e.g., the parent node pointers, the folded instance pointers, etc. This is one of the ways that the inventive lightweight occurrence model appears to the user to be a full occurrence model.

The inventive lightweight occurrence model maintains the instance specific information in a more permanent and organized manner than that of the prior art. The hash tables used by the prior art are external from the model. The hash tables are also written by a designer for their own use and are discarded when that use is finished. Information needed at a subsequent time and/or by a different designer is rewritten into a new hash table. Consequently, the use of hash tables results in error prone and inconsistent analysis. Thus, the specific information for the inventive model needs only to be written once and is maintained with the inventive model.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

As stated earlier, a fundamental limitation of the prior art folded connectivity model is its inability to represent a truly unique addressable object for each object created across the design hierarchy. As a result, the space-efficient storage of the folded model does not maintain the context within which an instance or net occurs, so the folded model does not retain enough context to store occurrence specific information. The ability to maintain this context is especially important for analysis and circuit modeling tools (such as timing and noise analysis engines and circuit understanding tools) which need to model the detailed effects of the net as it is represented in its flattened form (i.e., as it is eventually laid out on Silicon). For example, consider the net B 421 in FIG. 2B. In the folded connectivity representation (FIG. 4), there is only one in-memory storage element to represent the net B 421 in the cell FA 404.

Figure 1:
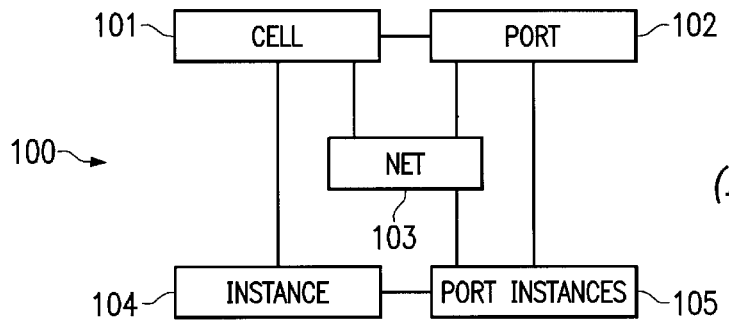
FIG. 1 depicts a schematic illustration of a full occurrence model of the prior art.
Figure 2A:
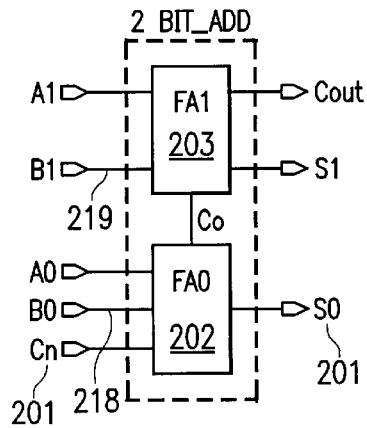
FIGS. 2A–2C depict a graphical representation of the hierarchical information in a full occurrence model of the prior art.

In order to find the nets that are connected to net B 421 one level up in the hierarchy, describer links 409 and 410 are followed to the instances in cell 2_BIT_ADD which are described by the cell FA 404. In this case, the instances FA0 and FA1 are found. To find the nets to which net B is connected, we must then find the net(s) in cell 2_BIT_ADD that are connected to the port instance, B, attached to each instance, FA0 and FA1 must be found. In this case, port instance B of instance FA0 is connected to net B0 in cell 2_BIT_ADD and port instance B of instance FA1 is connected to net B1. However, from the single net B 421 in the folded model, there is not enough information to determine which occurrence of net B is being analyzed (whether it is connected to B0 or B1). The lack of context becomes more problematic as more levels of hierarchy are added (for example, consider the further ambiguity that would be created if the cell 2_BIT_ADD were to be instantiated several times one level up in the hierarchy). This can best be illustrated in the example by following the net B down one level of hierarchy. In FIG. 2B, the net connects to three instances, NO1, XO1, and NA1 in the folded model. Since cell FA is instantiated 2 times in cell 2_BIT_ADD (instances FA0 and FA1), there are 2 occurrences of net B that connects to 2 occurrences of each instance (FA0/NO1, FA0/ZO1, FA0/NA1, FA1/NO1, FA1/ZO1, FA1/NA1). In doing many types of analysis of net B, the occurrence being analyzed must be known in order to obtain accurate results.

Figure 2C:
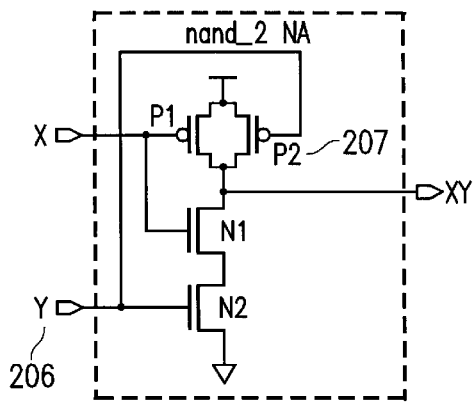
Figure 2B:
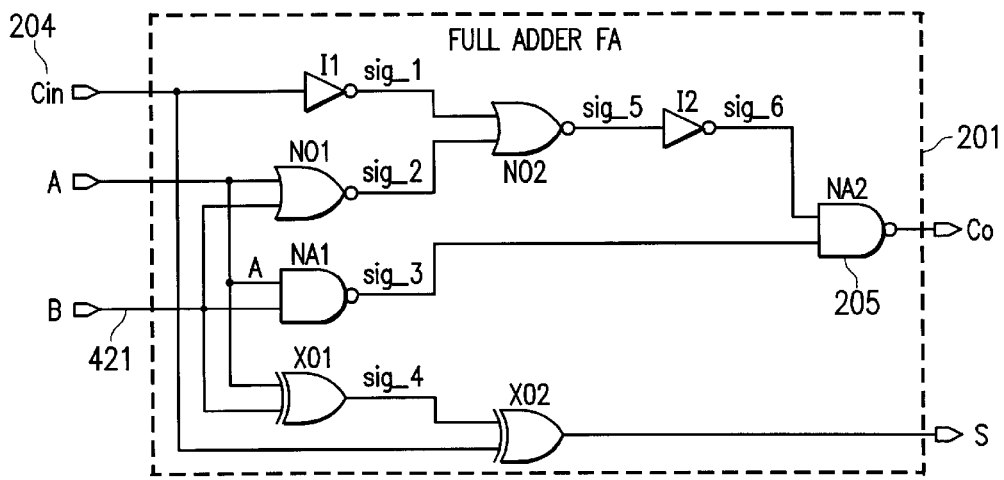

Furthermore, in following net B into cell NA1, it can be seen that net B is connected to net Y 206 inside of cell NA (from FIG. 2C). In the folded model, this net is represented as Y 420 owned by cell NA 406. However, designers cannot distinguish which of the 4 occurrence of net Y they have (FA0/NA1/Y 211, FA0/NA2/Y 212, FA1/NA1/Y 207, or FA1/NA2/Y 209).

The design of the folded connectivity model is an artifact of the way circuit designers enter in schematic designs. The concept of hierarchy is useful to the circuit designer because it allows him or her to operate at higher levels of abstraction and reduce complexity. However, when the hierarchy is flattened (removed), the folded connectivity model is insufficient at maintaining the necessary hierarchical context to analyze and store occurrence specific information (such as the actual placement, orientation, and size of each occurrence). It is important to note that process of flattening the hierarchy is a necessary step as the chip design progresses from the abstract functional viewpoint of the designer to the actual production of the circuitry on Silicon. As a result, it is important to many of today's tools to model the signal effects as seen in the flattened form.

Prior to the inventive light weight occurrence model, designers had no reusable mechanism for supporting the analysis of occurrences of nets through the design hierarchy. As stated earlier, flattening has become impractical for most circuitry created in today's microprocessors (and today's state-of-the-art IC processes). As a result, many applications were relying on naming conventions and data structures (such as hash tables or maps) maintained external to the folded connectivity model in order to build storage to maintain the context necessary to uniquely identify occurrences of nets and to provide a location for occurrence-specific storage. These external structures have the disadvantages of not being reusable and of lacking tighter integration with the folded connectivity view (which yields easier traversal between the two different views of the design).

Figure 5:
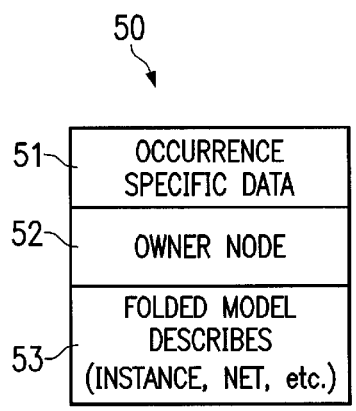
FIG. 5 depicts a schematic illustration of an inventive occurrence node.

FIG. 5 depicts an example of an occurrence node 50 that provides the occurrence specific information and is associated with a corresponding object in the folded model. There would be at least one occurrence node for corresponding net, cell, and port instances of a folded model. For example, using the model of prior art FIG. 4, there would be an occurrence node 50 for each full adder instance 402, 403 of the two bit adder cell 400, as well as for the nets, ports, and port instances of cell 400.

Figure 3:
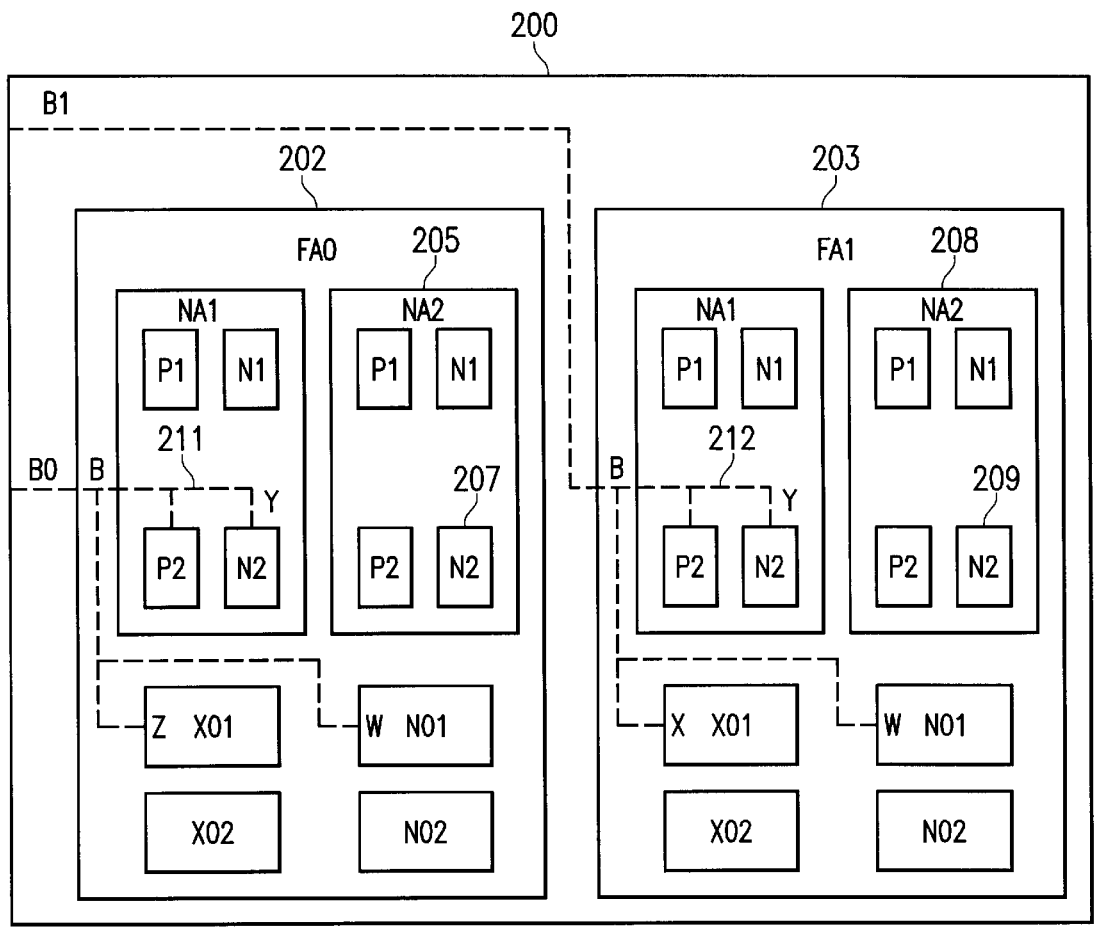
FIG. 3 depicts a graphical representation of the full occurrence model of the example of FIGS. 2A–2C.

Each node includes occurrence specific data 51. This data may be the information that is used to make the instance unique, e.g., net timing delay, resistance, capacitance, power grid, simulation testing values. For example, FIG. 3 includes two Y nets 211 and 212, one in FA0 and the other in FA1. However, nets B0 and B1 are of different lengths, thus the timing characteristics for each Y net will be different.

Each node 50 includes an owner node pointer 52. Note that the owner is an occurrence instance and each net has a different owner. This pointer 52 arranges the occurrence nodes in a hierarchical format by pointing to a preceding occurrence instance in the hierarchy of nodes. Since it is unique for any occurrence node, meaning that no two occurrence nodes with the same describer (instance, net, port instance) could share the same pointer 52, the pointer can be used as a search key for fast retrieval of any occurrence node in STL container from the folded model. For example, the owner for Y net 211 is 2 bit_adder/FA0/NA1 and the owner for Y net 212 is 2 bit_adder/FA1/NA1.

Figure 4:
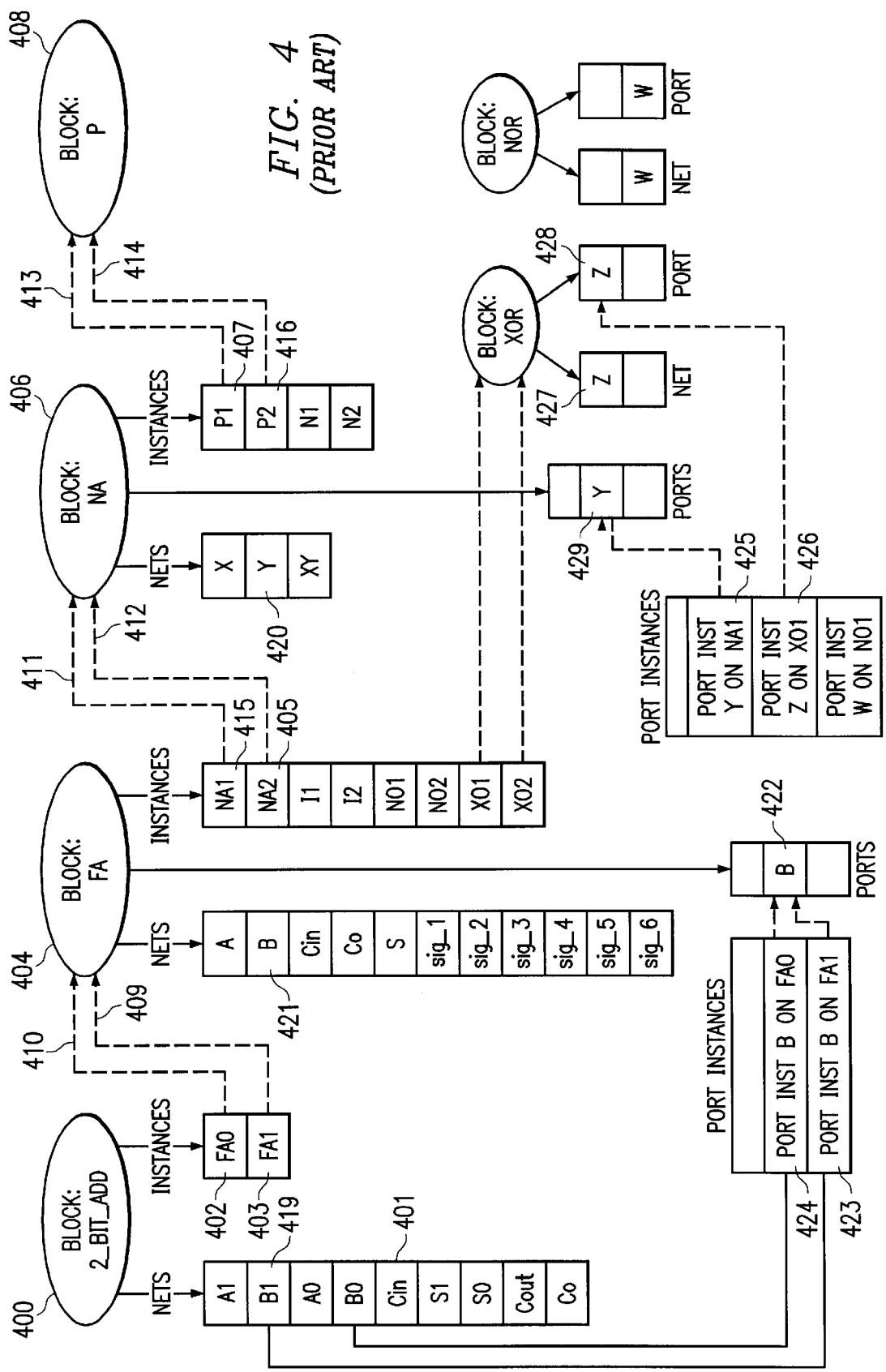
FIG. 4 depicts a schematic illustration of a folded connectivity model of the prior art using the example of FIGS. 2A–2C.

Each node 50 also includes a folded model describer pointer 53. This pointer 53 points to the instance, or net, or port instance to which the node 50 is associated in the folded model For example, both 211 and 212 would have pointer 53 pointing to net_Y 420 (FIG. 4). This sharing of information greatly saves memory space of the model. Pointer 53 allows occurrence nodes with the same describer to share the same information in the folded model. This pointer and pointer 52 play a very important role in the inventive traversing algorithm.

All occurrence nodes 50 are physically stored in corresponding instance, net, and port instance in the folded model. For example, occurrence net nodes 2_BIT_ADD/FA0/B, and 2_BIT_ADD/FA1/B are stored in net B at the cell block FA 404.

As stated earlier, traversing a net through the various levels of hierarchy is very difficult because of a lack of pointers between the levels. This may be overcome by storing additional information, e.g., pointers in the model. However, this will greatly increase the size of the model, and make it more difficult to store and analyze the model. Therefore, it is preferable to use the inventive method and apparatus for traversing between net levels. This invention includes two algorithms: traversing up to retrieve the parent occurrence net at the higher level of the hierarchy that connects to the current occurrence net; and traversing down to retrieve the child occurrence net(s) at the lower level of the hierarchy that connects to the current occurrence net.

Figure 6:
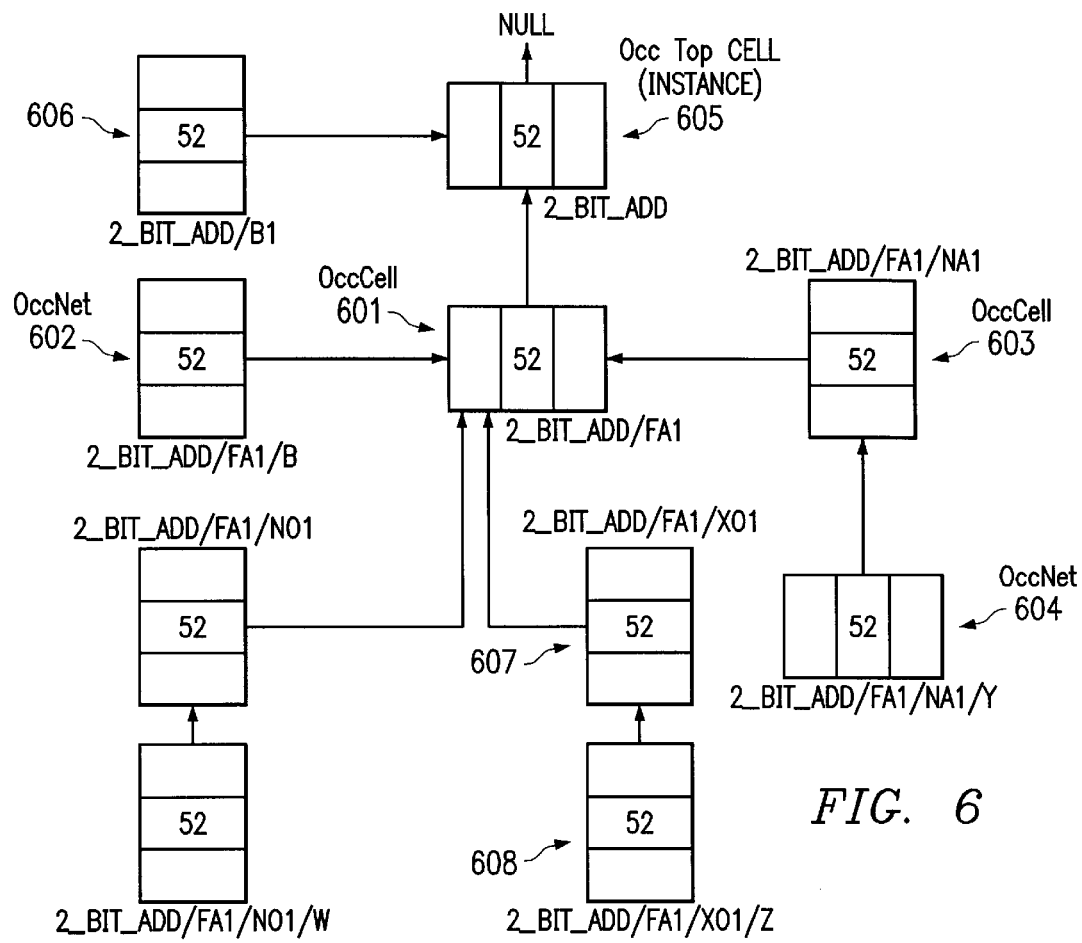
FIG. 6 depicts a portion of the arrangement of FIG. 3 using the inventive node of FIG. 5.

FIG. 6 depicts an example of the inventive lightweight occurrence model 600, shown at high level, having an upper level net 602 that is associated with an upper level cell instance 601 and a lower level net 604 that is associated with a lower level cell instance 603. The inventive traversing method and apparatus would allow a designer to move from net 602 to net 604 or to move from net 604 to net 602. The relationship between these net is referred to as parent (upper) and child (lower). These relationships of this figure follows the example shown in FIGS. 2–4, wherein upper level net B1 is connected to lower level net B, which in turn is connected to lowest level nets Y, Z, W. Note that a child can have at most only one parent, while a parent may have many children. Thus, any particular net may have one parent or none (i.e., it is the highest signal), and any particular net may have one or more children or none (i.e., it is the lowest level signal net). Also, note that it is possible for net to connect no children occurrence net and still not be the lowest level signal net. This may occur because the net is part of a partial tree, where one or more children have not been put into the tree.

Figure 7:
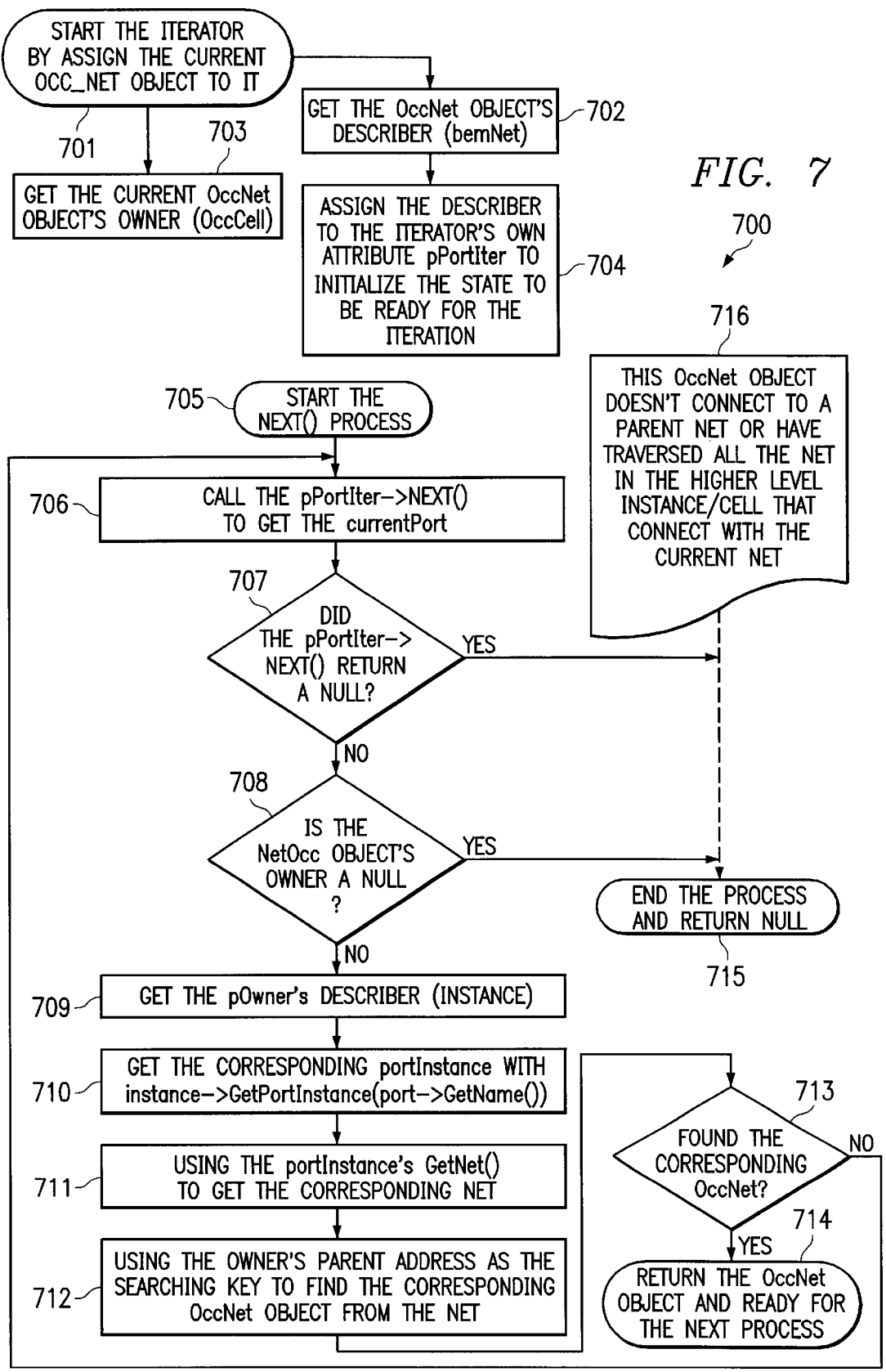
FIG. 7 depicts a flow chart of the operation of the invention in moving up one net level in hierarchy.
Figure 8:
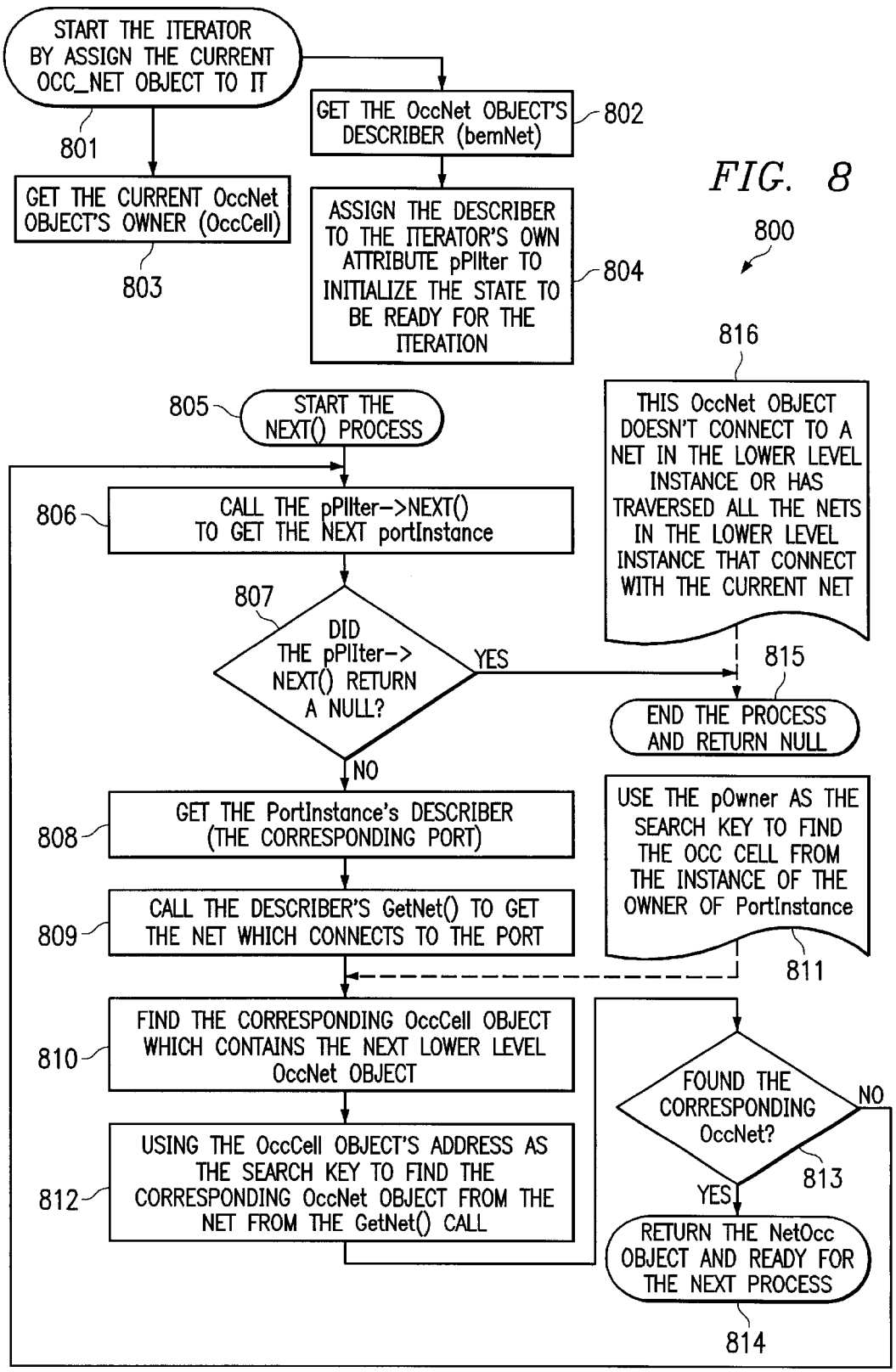
FIG. 8 depicts a flow chart of the operation of the invention in moving down one net level in hierarchy.

The inventive traversing method and apparatus, or iterator, has two stages. The first stage initializes the iterator and the second stage finds the net at the desired level, if it exists. Note that iterator moves up or down one level at a time. The process by which the iterator operates depends upon whether the user desires to move up a level to a parent node, or down a level to a child node. FIG. 7 depicts the initialization and location stages for the parent traverse iterator, which moves up a level. FIG. 8 depicts the initialization and location stages for the child traverse iterator, which moves down a level. Each iterator encapsulates a complete search that walk through the folded and occurrence models but hides the complication from the user.

FIG. 7 shows the traverse up to retrieve the parent occurrence net from the level above. This operation is better understood when described in terms of an example. In the example a designer desires to move from the occurrence net object 602 to occurrence net object 606 in FIG. 6, which is also net B of 203 to net B1 of 200 in FIG. 3. In FIG. 7, the iterator 700 is initialized by assigning the current occurrence net object to the iterator. This assigns a starting occurrence net—the current occurrence net to the iterator (701), for example block 602, 2_BIT_ADD/FA1/B, of FIG. 6. The iterator then retrieves 703 the current net object's owner (through pointer 52 of the current occurrence net), which is the occurrence cell that the net object's owner (through pointer 52 of the current occurrence net), which is the occurrence cell that the net object is associated with, for example block 601, 2_BIT_ADD/FA1. The iterator also retrieves 702 the current net object's describer, which is the net object in the folded model (through pointer 53 of the current occurrence net to get the net B 421). The iterator then assigns 704 the describer to a port iterator which is in the folded model to complete the initialization.

The iterator then invokes next() process 705 to begin to find the parent net occurrence object, which is block 602. The iterator uses 706 the describer in the port-iterator try to retrieve the first port that connects to the net object, which in the example would return port B 422. Note that a port can connect to only one net, while one net may connect to many ports. Further note that ports are connection points, and from the inside of a block the connection is a port, but from the outside, the connection is a port instance. For example, as shown in FIG. 4, box Port B@FA0 424 and box Port B@FA1 423 are port instances in the folded model as 105, and they are connect to net B0 218 and net B1 219, respectively, while inside of instances 203 and 202 (from FIG. 2A). However, from inside of instance 203 or 202, which are the full_bit_add FIG. 2B, the Port B 422 connects to net B 421. So that nets B0 209 and B1 208 are connected with net B 421.

The iterator then checks to see if the current port is null 707 or if the net objects owner is a null 708. If either is true, then the process ends 715, because the net object is either the highest signal and does not connect to a parent net, or the iterator has already traversed all nets in the higher level object that connect with the current occurrence net. This may also indicate a partial tree, for example sig_4 of FIG. 2B does not have a parent.

If both checks are false, as for the occurrence net 2_BIT_ADD/FA1/B 602 traverse up, the iterator uses 709 the current occurrence net owner 601, which is an occurrence instance object 2_BIT_ADD/FA1, to retrieve its describer FA1 403 in the folded model. Note that each instance has at least one or more port instances that are connected to it.

The iterator then uses a function "GetPortInstance" of instance in the folded model with port B 422 information it received from step 706 and retrieves the corresponding port instance Port_B@FA1 423 in step 710. In step 711, since each port instance can only connect to one net, then the iterator can readily find the net B1 219 (419 of FIG. 4) in the folded model that connects to the port instance 423, namely net B1 of block 400.

The iterator then uses the owner's (occurrence instance node 2_BIT_ADD/FA1 601) owner pointer, which is occurrence instance node 2_BIT_ADD 605, as the searching key to search a set of occurrence net nodes contained in a map container in B1 419 (or 219) of the folded model at step 712. The iterator then checks to see if there is a match 713. If there is a match, then there is an occurrence net that connects to the current occurrence net at the higher level, in this example, it is the occurrence net to 2_BIT_ADD/B1 606. This a O(logN) performance operation, which is a binary search that narrows the database by half with each increment. In the example, this step will yield 606. The occurrence net object is returned and the iterator is ready for the next process for step 704.

If it does not find it, then the iterator will return to block 706 and re-run, by retrieving the next part that connects to the net object.

FIG. 8 shows the traverse down to retrieve occurrence net(s) at the lower level that connect to the current occurrence net. Again, this operation is better understood when described in terms of an example. In the example a designer desires to move from the occurrence net object 602 to occurrence net object 604 in FIG. 6, which is also net B of 203 to net Y 212 in FIG. 3. In FIG. 8, the iterator 800 is initialized by assigning the current occurrence net object to the iterator. At step 801, this assigns a starting occurrence net, the current occurrence net, to the iterator, for example block 602, 2_BIT_ADD/FA1/B, of FIG. 6. The iterator then retrieves 803 the current net object's owner (through pointer 52 of the assigned current occurrence net), which is the occurrence cell that the net object is associated with, for example block 601, 2_BIT_ADD/FA1. The iterator also retrieves 802 the current net object's describer, which is the net object in the folded model (through pointer 53 of the current occurrence net to get the net B 421). The iterator then assigns 804 the describer of the current occurrence net, net B 421 to a port instance iterator which is in the folded model to complete the initialization. Net B 421 includes a list of all port instances that connect to it.

The iterator then invokes next() process 805 to begin to find the children net occurrence objects, the desired object of the example being block 604 (2_BIT_ADD/FA1/NA1/Y). The port-instance-iterator is invoked 806 to locate the next port instance of the net object, which in the example is port_Y at NA1 425.

The iterator then checks to see if the retrieved port instance is null 807. If true, then the process ends 815, because the net object is the lowest level and does not connect to a child net, or the iterator has already traversed all nets in the lower level that connect with the current net. If the check is false, such as in this example, then the iterator retrieves the port instance's describer, which is the corresponding port at step 808. This is the folded model port Y 429 under block 406. The iterator then calls the port Y object's function GetNet() to locate the net connected to the port in step 809. Note that each port only connects to one net. For this example, port Y 429 connects to net Y 420.

In step 811, the iterator then uses the pOwner (601) as the search key to search a map container of the instance of the owner of the port instance (425), which is NA1 415. The search operation is a O (LogN) searching operation in a set of occurrence net nodes contained in the map container. In step 810 the result of the search is returned, which is 2_BIT_ADD/FA1/NA1 603.

In step 812, the iterator uses the occ cell returned from step 810, namely 603, as the search key to search a map container of net located by step 809, namely Y 420. The container of the net comprises a list of occurrence nets (occ nets) that use net Y 420 of the folded model as their describer. The iterator looks for matches 813. If a match is found, then the iterator returns the occurrence net object, in this case it will be occurrence net 2_BIT_ADD/FA1/NA1/Y 604, and is ready for the next operation 814. If a match is not found, then the iterator returns to box 806 to begin again, if desired. For example, in repeating this operation, the iterator will return occurrence net 2_BIT_ADD/FA1/XO1/Z, and then occurrence net 2_BIT_ADD/FA1/NO1/W on a subsequent desired operation. Since the current occurrence net only connects 3 occurrence nets at the lower level of the hierarchy, the last iterator->Next() operation will return NULL as it reaches the end 815.

When implemented in software, the elements of the present invention are essentially the code segments to perform the necessary tasks. The program or code segments can be stored in a processor readable medium or transmitted by a computer data signal embodied in a carrier ware, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

Figure 9:
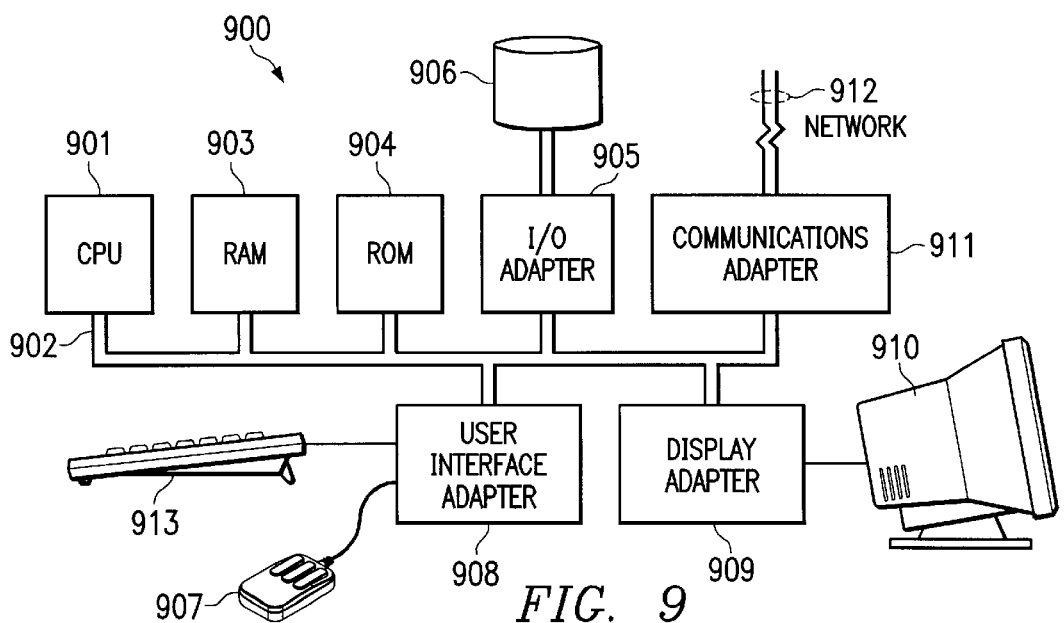
FIG. 9 depicts a block diagram of a computer system which is adapted to use the present invention.

FIG. 9 illustrates computer system 900 adapted to use the present invention. Central processing unit (CPU) 901 is coupled to system bus 902. The CPU 901 may be any general purpose CPU, such as an HP PA8500 or Intel Pentium processor. However, the present invention is not restricted by the architecture if CPU 901 as long as CPU 901 supports the inventive operations as described herein. Bus 902 is coupled to random access memory (RAM) 903, which may be SRAM, DRAM, or SDRAM. ROM 904 is also coupled to bus 902, which may be PROM, EPROM, or EEPROM. RAM 903 and ROM 904 hold user and system data and programs as is will known in the art.

Bus 902 is also coupled to input/output (I/O) controller card 905, communications adapter card 911, user interface card 908, and display card 909. The I/O card 905 connects to storage devices 906, such as one or more of hard drive, CD drive, floppy disk drive, tape drive, to the computer system. Communications card 911 is adapted to couple the computer system 900 to a network 912, which may be one or more of telephone network, local (LAN) and/or wide are (WAN)network, Ethernet network, and/or Internet network. User interface card 908 couples user input devices, such as keyboard 913 and pointing device 907, to the computer system 900. The display card 909 is driven by CPU 901 to control the display on display device 910.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for traversing between a higher level net occurrence and a lower level net occurrence in a hierarchical model of a system design, wherein the model includes a first cell that describes a first device within the system and a second cell that describes a second device within the system, wherein the higher level net occurrence is associated with the first cell and the lower level net occurrence is associated with the second cell and the first cell is at least one level higher in the model than the second cell, the method comprising:

defining a current net occurrence, which is one of the higher level net occurrence and the lower level net occurrence;

retrieving a first describer pointer for the current net occurrence, wherein the first describer pointer points to a model object that is used to describe the current net occurrence;

retrieving a first owner pointer for the current net occurrence, wherein the owner pointer points to the owner cell of the current net occurrence; and using the current net model object of the current net and owner cell to traverse the hierarchical model.

2. The method of claim 1 wherein the current net occurrence is lower level net occurrence, the owner cell is the second cell, and the model is being traversed from the lower level net occurrence to the higher level net occurrence, wherein the step of using comprises:

locating a port in the model that is associated with the current net model object.

3. The method of claim 2 wherein the step of using further comprises:

retrieving a second describer pointer for the owner cell, wherein the second describer pointer points to a model instance that is used to describe the owner cell; and locating the owner cell instance in the model pointed to by the second describer pointer.

4. The method of claim 3 wherein the step of using further comprises:

locating a port instance in the model using the owner cell instance and the port.

5. The method of claim 4 wherein the step of using further comprises:

locating a higher level net model object that is associated with the port instance.

6. The method of claim 5 wherein the step of using further comprises:

retrieving a second owner pointer for the owner cell, wherein the second owner pointer points to the first cell; and searching a container associated with the higher level net model object using the second owner pointer as a search key;

wherein the container includes a list of net occurrences associated with the higher level net model object.

7. The method of claim 6 wherein the step of searching has found a match with the search key, the step of using further comprising:

returning the higher level net occurrence located by the step of searching.

8. The method of claim 6 wherein the step of searching has not found a match with the search key, the step of using further comprising:

repeating the step of locating a port in the model that is associated with the current net model object using another port.

9. The method of claim 1 wherein the current net occurrence is higher level net occurrence, the owner cell is the first cell, and the model is being traversed from the higher level net occurrence to the lower level net occurrence, wherein the step of using comprises:

locating a port instance in the model that is associated with the current net model object.

10. The method of claim 9 wherein the step of using further comprises:

retrieving a second describer pointer for the port instance, wherein the second describer pointer points to a port that is used to describe the port instance; and locating the port in the model pointed to by the second describer pointer.

11. The method of claim 10 wherein the step of using further comprises:

locating a lower level net model object that is associated with the port.

12. The method of claim 11 wherein the step of using further comprises:

retrieving a second owner pointer for the port instance, wherein the second owner pointer points to a model instance that is used to describe the second cell;

searching a container associated with the second cell model instance using the first owner pointer as a search key;

wherein the container includes a list of cells associated second cell model instance.

13. The method of claim 12 wherein the step of using further comprises: returning the second cell from the step of searching.

14. The method of claim 13 wherein the step of using further comprises:
   searching a container associated with the lower level net model object using the second cell as a search key;
   wherein the container includes a list of net occurrences associated with the lower level net model object.

15. The method of claim 14 wherein the step of searching a container associated with the lower level net model object has found a match with the search key, the step of using further comprising:
   returning the lower level net occurrence located by the step of searching.

16. The method of claim 14 wherein the step of searching a container associated with the lower level net model object has not found a match with the search key, the step of using further comprising:
   repeating the step of locating a port instance in the model that is associated with the current net model object using another port instance.

17. An system for traversing between a higher level net occurrence and a lower level net occurrence in a hierarchical model of a system design, wherein the model includes a first cell that describes a first device within the system and a second cell that describes a second device within the system, wherein the higher level net occurrence is associated with the first cell and the lower level net occurrence is associated with the second cell and the first cell is at least one level higher in the model than the second cell, the system comprising:
   means for defining a current net occurrence, which is one of the higher level net occurrence and the lower level net occurrence;
   means for retrieving a first describer pointer for the current net occurrence, wherein the first describer pointer points to a model object that is used to describe the current net occurrence;
   means for retrieving a first owner pointer for the current net occurrence, wherein the owner pointer points to the owner cell of the current net occurrence; and
   means for using the current net model object of the current net and owner cell to traverse the hierarchical model.

18. A computer program product having a computer readable medium having computer program logic recorded thereon for traversing between a higher level net occurrence and a lower level net occurrence in a hierarchical model of a system design, wherein the model includes a first cell that describes a first device within the system and a second cell that describes a second device within the system, wherein the higher level net occurrence is associated with the first cell and the lower level net occurrence is associated with the second cell and the first cell is at least one level higher in the model than the second cell, the computer program product comprising:
   code for defining a current net occurrence, which is one of the higher level net occurrence and the lower level net occurrence;
   code for retrieving a first describer pointer for the current net occurrence, wherein the first describer pointer points to a model object that is used to describe the current net occurrence;
   code for retrieving a first owner pointer for the current net occurrence, wherein the owner pointer points to the owner cell of the current net occurrence; and
   code for using the current net model object of the current net and owner cell to traverse the hierarchical model.

19. The computer program product of claim 18 wherein the current net occurrence is lower level net occurrence, the owner cell is the second cell, and the model is being traversed from the lower level net occurrence to the higher level net occurrence, wherein the code for using comprises:
   code for locating a port in the model that is associated with the current net model object.

20. The computer program product of claim 18 wherein the current net occurrence is higher level net occurrence, the owner cell is the first cell, and the model is being traversed from the higher level net occurrence to the lower level net occurrence, wherein the code for using comprises:
   code for locating a port instance in the model that is associated with the current net model object.

* * * * *